United States Patent
Sato et al.

(10) Patent No.: US 7,406,646 B2
(45) Date of Patent: **\*Jul. 29, 2008**

(54) MULTI-STROBE APPARATUS, TESTING APPARATUS, AND ADJUSTING METHOD

(75) Inventors: Shinya Sato, Tokyo (JP); Satoshi Sudou, Tokyo (JP); Masaru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 495 days.

This patent is subject to a terminal disclaimer.

(21) Appl. No.: 11/096,702

(22) Filed: Apr. 1, 2005

(65) Prior Publication Data

US 2005/0219937 A1 Oct. 6, 2005

Related U.S. Application Data

(63) Continuation of application No. PCT/JP03/12094, filed on Sep. 22, 2003.

(30) Foreign Application Priority Data

Oct. 1, 2002 (JP) .............................. 2002-289283

(51) Int. Cl.
  *G06F 11/00* (2006.01)
  *G01R 31/28* (2006.01)
  *G11B 20/20* (2006.01)
(52) U.S. Cl. .................. 714/744; 714/700; 714/731
(58) Field of Classification Search ................ None
  See application file for complete search history.

(56) References Cited

U.S. PATENT DOCUMENTS

| | | | |
|---|---|---|---|
| 6,182,233 B1 * | 1/2001 | Schuster et al. ............. 713/400 |
| 6,420,921 B1 | 7/2002 | Okayasu et al. | |
| 6,477,674 B1 * | 11/2002 | Bates et al. .................. 714/738 |
| 6,629,274 B1 * | 9/2003 | Tripp et al. .................. 714/721 |
| 6,696,862 B2 * | 2/2004 | Choi et al. ..................... 326/93 |
| 6,715,096 B2 * | 3/2004 | Kuge ........................... 713/600 |
| 6,789,224 B2 * | 9/2004 | Miura ......................... 714/744 |
| 6,973,103 B2 * | 12/2005 | Hayashi et al. ............. 370/516 |

FOREIGN PATENT DOCUMENTS

| | | |
|---|---|---|
| JP | 5-45418 | 2/1993 |
| JP | 7-27836 | 1/1995 |

(Continued)

OTHER PUBLICATIONS

IBM Technical Disclosure Bulletin, NN8006328 Zero Delay Set Reset Latch with Edge-Triggered Strobe Control. Jun. 1980 vol. 23 Issue 1 pp. 328-329.*

(Continued)

*Primary Examiner*—Cynthia Britt
(74) *Attorney, Agent, or Firm*—Osha Liang LLP (57) ABSTRACT

A multi-strobe apparatus for generating multi-strobe having a plurality of strobes is provided, wherein the multi-strobe apparatus includes a clock generating unit which is able to generate a signal for adjustment at a timing at which each of the plurality of strobes should be generated; a strobe generating circuit for generating the plurality of strobes; and an adjusting module for adjusting a timing of the strobe generating circuit's generating each of the strobes on the basis of the signal for adjustment.

13 Claims, 6 Drawing Sheets

FOREIGN PATENT DOCUMENTS

| | | |
|---|---|---|
| JP | 10-73645 | 3/1998 |
| JP | 2001-27660 | 1/2001 |
| JP | 2002-181899 | 6/2002 |
| JP | 2002-196049 | 7/2002 |
| WO | WO 01/13136 A1 | 2/2001 |
| WO | WO 2004/031788 A1 | 4/2004 |

OTHER PUBLICATIONS

International Search Report dated Jan. 13, 2004 (2 pages).

Patent Abstracts of Japan; Publication No. 2002-196049 dated Jul. 10, 2002 (1 page).

Patent Abstracts of Japan; Publication No. 10-073645 dated Mar. 17, 1998 (1 page).

Patent Abstracts of Japan; Publication No. 2001-027660 dated Jan. 30, 2001 (1 page).

Patent Abstracts of Japan; Publication No. 07-027836 dated Jan. 31, 1995 (1 page).

Patent Abstracts of Japan; Publication No. 05-045418 dated Feb. 23, 1993 (1 page).

Patent Abstracts of Japan; Publication No. 2002-181899 dated Jun. 26, 2002 (1 page).

\* cited by examiner

MULTI-STROBE APPARATUS, TESTING APPARATUS, AND ADJUSTING METHOD

The present application is a continuation application of PCT/JP2003/012094 filed on Sep. 22, 2003, claiming priority from a Japanese patent application No. 2002-289283 filed on Oct. 1, 2002, the contents of which are incorporated herein by reference.

BACKGROUND OF THE INVENTION

1. Field of the Invention

The present invention relates to a multi-strobe apparatus for generating multi-strobe having a plurality of strobes, a testing apparatus for testing an electronic device, and an adjusting method for adjusting a timing of generating a strobe of each strobe of the multi-strobe. More particularly, the present invention relates to a multi-strobe apparatus for controlling a timing of generating each strobe.

2. Description of Related Art

Conventionally, in case of detecting a variation point of a value of a signal to be measured, one strobe is delayed at every cycle of the signal to be measured and is output, the value of the signal to be measured is detected for each strobe, and variation in the value is detected. This method is used to detect a variation point of the value of each of a data signal and a DSQ signal, etc. for a memory setup/hold testing, for example.

A device of double data rate type which outputs a data signal synchronously with a rising or a falling of a clock (DQS) like DDR-SDRAM (Double Data Rate-SDRAM), for example, makes the data signal follow up the clock for every predetermined width of the output data and outputs the data signal. Thus, a timing condition of setup/hold for data transfer is relieved. This kind of device is required to have a predetermined setup time and a predetermined hold time between the data signal and the clock in order to perform reset/hold of data without fault.

Conventionally, each of the values of the data signal and the clock is detected by one strobe and a variation point of each value is detected. Then, pass/fail of a device under test ("DUT") is determined according to whether or not the detected variation point satisfies the predetermined setup time and the predetermined hold time.

However, since each of the values of the data signal and the DSQ is detected at every cycle of each signal by one strobe, it is impossible to perform the testing accurately in case a jitter is generated in the data signal and the DSQ due to various causes such as power supply variation and heat variation of the device. Further, since the data signal and the DSQ are scanned by one strobe, it takes much time to perform the testing.

Accordingly, it is an object of the present invention to provide a multi-strobe apparatus, a testing apparatus, and an adjusting method, which are capable of overcoming the above drawbacks accompanying the conventional art. The above object can be achieved by combinations described in the independent claims. The dependent claims define further advantageous and exemplary combinations of the present invention.

SUMMARY OF THE INVENTION

In order to solve the problems above, according to the first aspect of the present invention, a multi-strobe apparatus for generating multi-strobe having a plurality of strobes is provided, wherein the multi-strobe apparatus includes a clock generating unit which is able to generate a signal for adjustment at a timing at which each of the plurality of strobes should be generated; a strobe generating circuit for generating the plurality of strobes; and an adjusting module for adjusting a timing of the strobe generating circuit's generating each of the strobes on the basis of the signal for adjustment.

The clock generating unit may generate the signals for adjustment sequentially at the plurality of timings at which the plurality of strobes should be generated, and on the basis of each of the signals for adjustment generated at the plurality of timings, the adjusting module may adjust a timing of the strobe generating circuit's generating corresponding strobe.

The strobe generating circuit may include a plurality of cascade-connected variable delay circuits each of which receives a strobe signal, delay the received strobe signal by a predetermined time, and output the strobe signal sequentially as the strobe, and on the basis of each of the signals for adjustment, the adjusting unit may adjust a delay time of corresponding variable delay circuit sequentially.

The clock generating unit may generate the signal for adjustment synchronously with the strobe signal. Further, the multi-strobe apparatus may further include a plurality of timing comparing units each of which is provided to correspond to one of the variable delay circuits and compares a timing of the strobe output by the corresponding variable delay circuit with the timing of the signal for adjustment, wherein the adjusting unit may adjust the delay time of each of the variable delay circuits on the basis of the comparison result of the corresponding timing comparing unit.

The adjusting unit may vary the delay time of the variable delay circuit of which delay time should be adjusted and sets the delay time of the variable delay circuit to be adjusted to the delay time at which the timing comparing unit determines that the timing of the strobe output by the variable delay circuit to be adjusted and the timing of the signal for adjustment are substantially the same.

The variable delay circuit may output the strobe a number of times at every delay time varied by the adjusting unit, the clock generating unit may generate the signal for adjustment of which value varies at the timing at which the adjusted variable delay circuit should output the strobe a number of times, the timing comparing unit may detect a value of the signal for adjustment by using the strobes output a number of times, and the adjusting unit may set the delay time of the variable delay circuit to the delay time at which the number of times of the timing comparing unit's detecting the value of the signal for adjustment before the value of the signal for adjustment is varied and that after the value of the signal for adjustment is varied are substantially the same.

The adjusting unit may include a comparison result selecting unit for selecting a comparison result of the comparing unit corresponding to the variable delay circuit to be adjusted out of the comparison results of the plurality of timing comparing units, and a fail counter for counting the number of detecting the value of the signal for adjustment before and after the value of the signal for adjustment is varied.

The multi-strobe apparatus may further include a plurality of cascade-connected delay elements each of which is provided to correspond to one of the plurality of variable delay circuits, delays the signal for adjustment by an offset delay amount of the corresponding variable delay circuit, and outputs the corresponding timing comparing unit with the signal for adjustment. Each of the delay elements may have characteristics substantially the same as those of the corresponding variable delay circuit and delay the signal for adjustment by the offset delay amount by using a delay path generating the minimum delay of a variable delay circuit for adjustment in which a delay amount of the delay path generating the minimum delay is substantially the same as a delay amount of a delay path generating the minimum delay of the corresponding variable delay circuit.

The clock generating unit may include an adjusting signal generating variable delay circuit for delaying the signal for adjustment by a desired delay amount and outputting it and a linearizing memory for controlling a delay amount of the adjusting signal generating variable delay circuit.

According to the second aspect of the present invention, a testing apparatus for testing an electronic device is provided, wherein the testing apparatus includes a pattern generating unit for generating a test pattern for testing the electronic device; a pattern formatter for formatting the test pattern and providing the electronic device with it; and a determining unit for determining pass/fail of the electronic device on the basis of an output signal output by the electronic device according to the test pattern, the determining unit includes a multi-strobe apparatus for generating multi-strobe having a plurality of strobes for detecting a value of the output signal, and the multi-strobe apparatus comprises a clock generating unit which is able to generate a signal for adjustment at a timing at which each of the plurality of strobes should be generated; a strobe generating circuit for generating the plurality of strobes; and an adjusting module for adjusting a timing of the strobe generating circuit's generating each of the strobes on the basis of the signal for adjustment.

According to the third aspect of the present invention, a testing method for adjusting a timing of generating each of a plurality of strobes included in multi-strobe is provided, wherein the testing method includes a signal for adjustment generating step of generating a signal for adjustment at a timing at which each of a plurality of strobes should be generated; a strobe generating step of generating the plurality of strobes; and an adjusting step of adjusting a timing of generating each of the strobes in the strobe generating step on the basis of the signal for adjustment.

The summary of the invention does not necessarily describe all necessary features of the present invention. The present invention may also be a sub-combination of the features described above.

BRIEF DESCRIPTION OF THE DRAWINGS

FIG. 2 describes an example of a setup testing of a DDR-SDRAM.

FIG. 5 describes timing adjustment of strobes output by each variable delay circuit 46.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
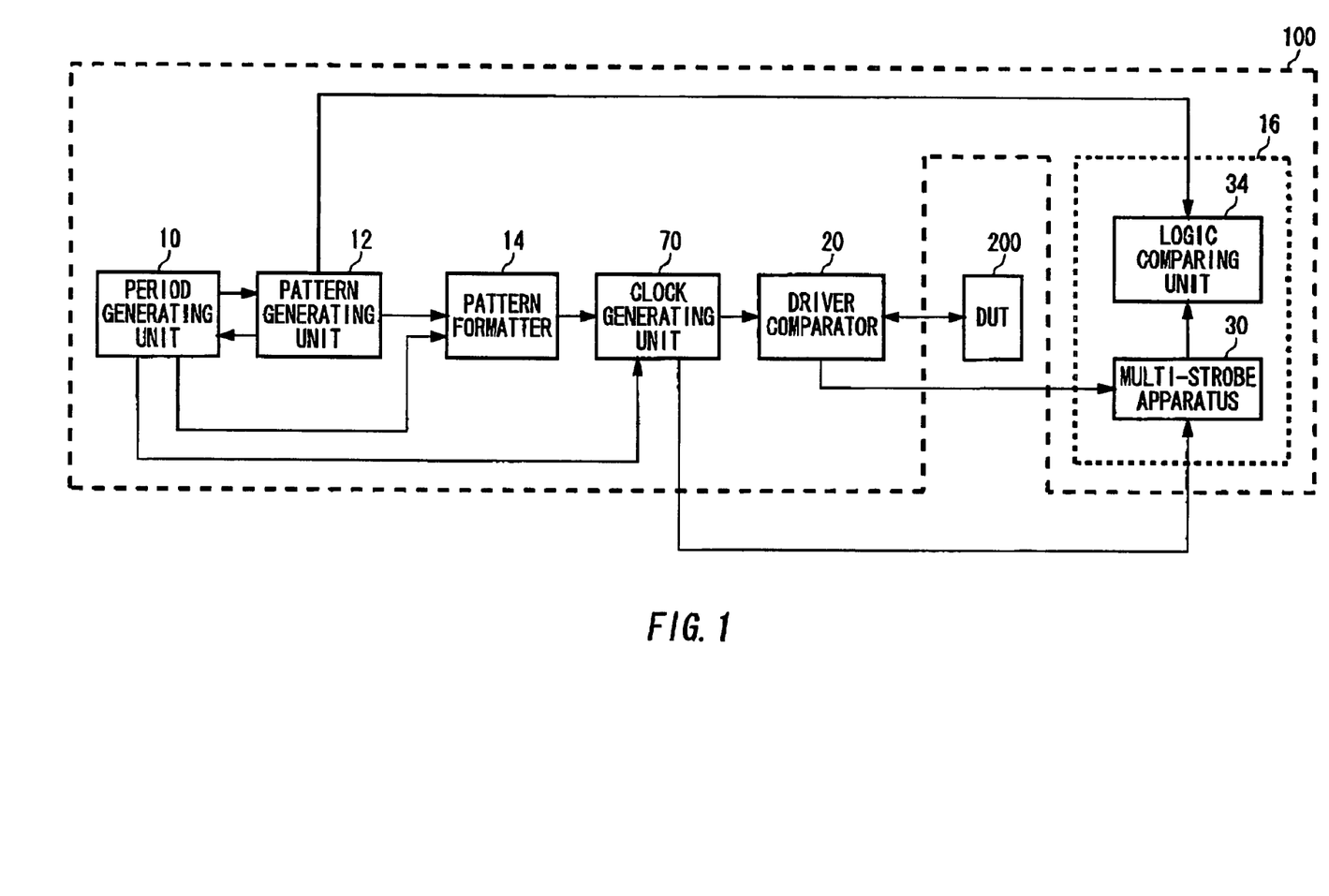
FIG. 1 shows an example of the configuration of a testing apparatus 100 according to an embodiment the present invention.

FIG. 1 shows an example of the configuration of a testing apparatus 100 according to an embodiment the present invention. The testing apparatus 100 tests an electronic device 200 by detecting a value of an output signal of the electronic device 200 by using multi-strobe having a plurality of strobes.

The testing apparatus 100 includes a period generating unit 10, a pattern generating unit 12, a pattern formatter 14, a clock generating unit 70, a driver comparator 20, and a determining unit 16. The period generating unit 10 generates a timing signal for operating the testing apparatus 100. For example, the period generating unit 10 receives a test set signal showing a timing of providing the electronic device 200 with a test pattern from the pattern generating unit 12. The period generating unit 10 provides the pattern formatter 14 with a signal showing the timing of providing the electronic device 200 with the test pattern. Further, the period generating unit 10 generates a reference clock for synchronizing the operation of the testing apparatus 100 and provides each of elements of the testing apparatus with the reference clock.

The pattern generating unit 12 generates a test pattern for testing the electronic device 200 and provides the pattern formatter 14 with the test pattern. The pattern formatter 14 and the clock generating unit 70 format the received test pattern and provide the electronic device 200 with the formatted test pattern via the driver comparator 20 according to the signal received from the period generating unit 10.

The determining unit 16 determines pass/fail of the on the basis of an output signal which the electronic device 200 outputs according to the given test pattern. The determining unit 160 generates multi-strobe having a plurality of strobes and includes a multi-strobe apparatus 30 for detecting a value of the output signal of the electronic device 200 by the generated multi-strobe and a logic comparing unit 34 for determining pass/fail of the electronic device 200 on the basis of the value of the output signal detected by the multi-strobe apparatus 30. The logic comparing unit 34 is provided with an expectation value signal which should be output by the electronic device 200 from the pattern generating unit 12 and determines pass/fail of the electronic device 200 by comparing the value of the output signal and the expectation value signal.

Further, the clock generating unit 70 may provide the multi-strobe apparatus 30 with a strobe signal for generating the multi-strobe. In this case, the period generating unit 10 provides the clock generating unit 70 with a timing signal and the clock generating unit 70 provides the multi-strobe apparatus 30 with the strobe signal on the basis of the received timing signal.

Further, the electronic device 200 may be, for example, a DDR-SDRAM, and the determining unit may receive a data signal of the DDR-SDRAM as an output signal and a DSQ which is a clock signal output synchronously with the data signal. In this case, the determining unit 16 may perform a setup/hold testing on the electronic device 200 on the basis of the received data signal and the DSQ and determine pass/fail of the electronic device 200.

FIG. 2 describes an example of a setup testing of the DDR-SDRAM. According to the present example, the testing apparatus 100 detects each of values of the DSQ and the data signal (DQ) by the multi-strobe and performs a setup testing on the electronic device 200. The DDR-SDRAM outputs the DQ and DSQ so that their rising edges substantially coincide with each other. However, the testing apparatus shifts a timing of generating the multi-strobe for detecting the value of DQ with respect to a timing of generating the multi-strobe for detecting the value of the DQS by a predetermined offset amount and detects each of the values. For example, a memory controller of the testing apparatus 100 which is used when the DDR-SDRAM is in use may shift the timing of generating the multi-strobe of a side of the DQ by the shift amount of the DQS with respect to the DQ.

Figure 2A:
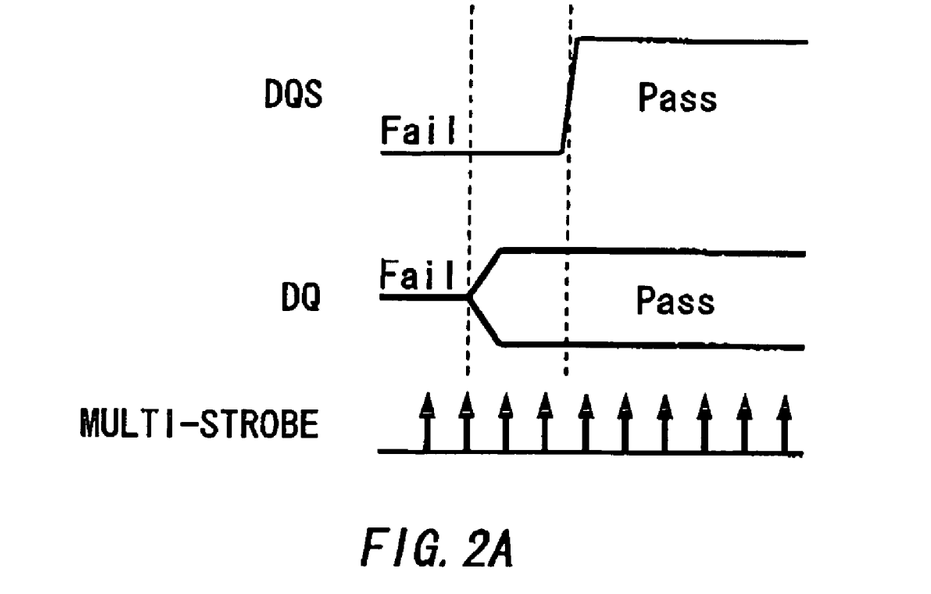
FIG. 2A shows an example of a timing chart of a DQS and a DQ and FIG. 2B shows another example of the timing chart.
Figure 2B:
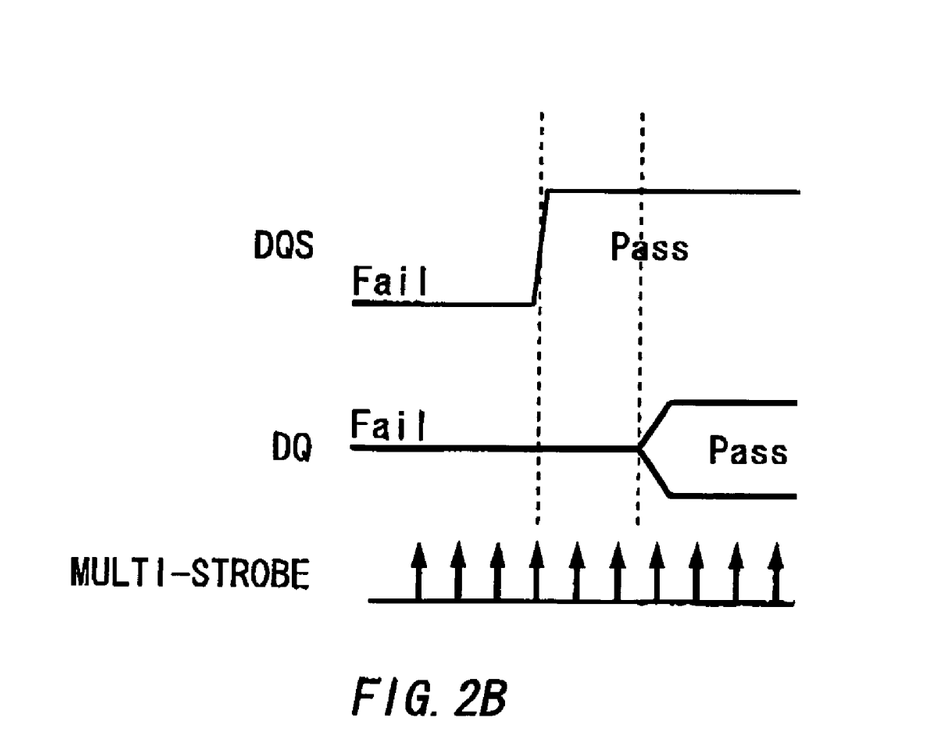

The testing apparatus 100 determines pass/fail of the DDR-SDRAM on the basis of whether or not the DDR-SDRAM outputs the DQ of a predetermined value at a variation point of the detected value of the DQS. FIGS. 2A and 2B show examples of timing charts of the DQS and the DQ. According to the example shown in FIG. 2A, since the DQ shows a predetermined value at the variation point of the value of the DQS, the testing apparatus 100 determines pass of the DDR-SDRAM. According to the example shown in FIG. 2B, since the DQ does not show a predetermined value at the variation point of the value of the DQS, the testing apparatus 100 determines fail of the DDR-SDRAM.

The testing apparatus 100 according to the present example detects the variation point of the value of each of the DQS and the DQ by using the multi-strobe. In other words, the testing apparatus 100 determines which one of the multi-strobe detects the variation point of the value of each of the DQS and the DQ and pass/fail of the DDR-SDRAM on the basis of the position of the strobe which detects the variation point of the value of each of the DQS and the DQ.

According to the testing apparatus 100 of the present example, since the values of the DQ and the DSQ are detected for one cycle by the multi-strobe having a plurality of strobes, it is possible to perform the testing accurately even in case delay times of the DQ and DQS are dispersed in every cycle. Further, it is possible to perform a hold testing on the DDR-SDRAM in a same way.

Figure 3:
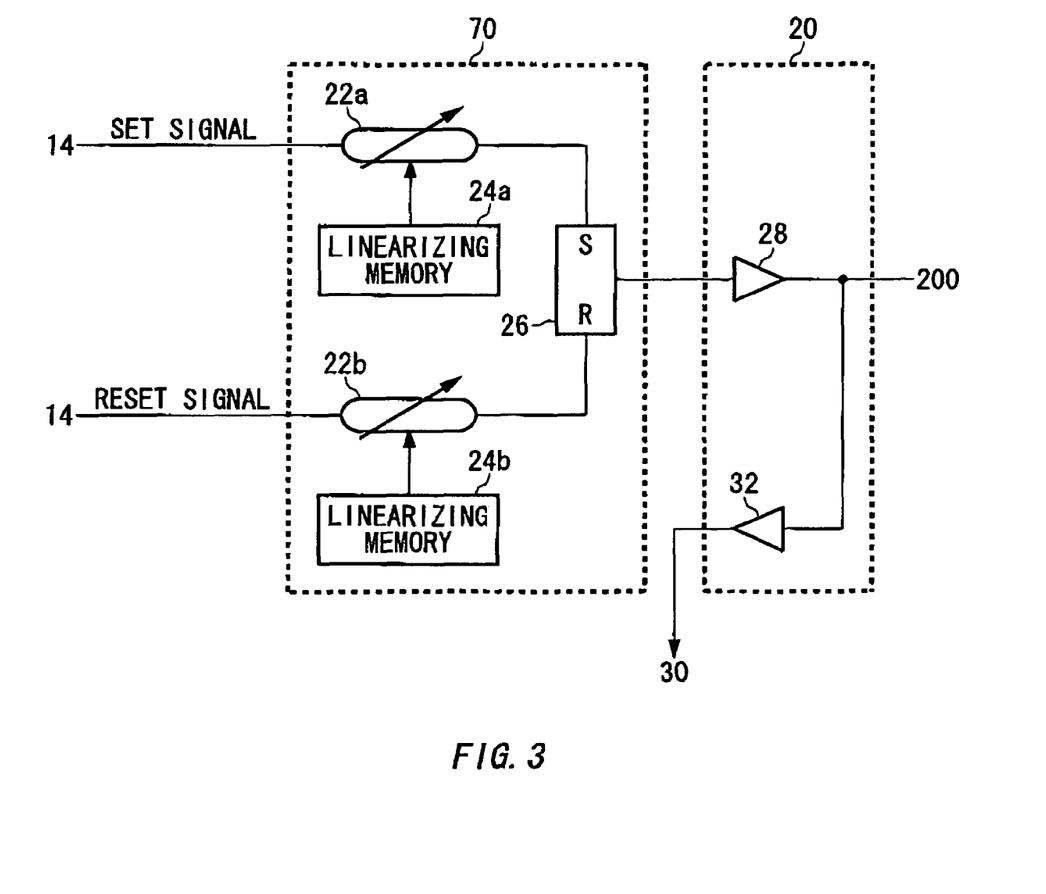
FIG. 3 shows an example of the configuration of a clock generating unit 70 and a driver comparator 20.

FIG. 3 shows an example of the configuration of the clock generating unit 70 and the driver comparator 20. The clock generating unit 70 receives a set signal and a reset signal responding to the test pattern from the pattern formatter 14 and generates a rising edge and a falling edge of the test pattern on the basis of the set signal and the reset signal.

The clock generating unit 70 includes a variable delay circuit 22a for delaying the set signal, a variable delay circuit 22b for delaying the reset signal, a linearizing memory 24a for controlling a delay time of the variable delay circuit 22a, a linearizing memory 24b for controlling a delay time of the variable delay circuit 22b, and a set/reset latch 26.

Each of the linearizing memories 24a and 24b controls the delay time of corresponding variable delay circuit 22 according to the test pattern which should be given to the electronic device 200. Each linearizing memory 24 stores control information for controlling the variable delay circuit 22 according to a delay set value and the control information is calibrated according to characteristics of the corresponding variable delay circuit 22. Thus, it is possible to control accurately the delay time of the variable delay circuit 22.

The set/reset latch 26 generates a rising edge and a falling edge of the test pattern to be provided to the electronic device 200 on the basis of the set signal and the reset signal which are delayed by each variable delay circuit 22 and provides the electronic device 200 with them via the driver comparator 20 and a driver 28. A comparator 32 of the driver comparator 20 compares an output signal output by the electronic device 200 and a predetermined value and provides the multi-strobe apparatus 30 with the comparison result. Here, the output signal may be the DSQ and the DQ described above.

The multi-strobe apparatus 30 detects the comparison result of the comparator 32 by the multi-strobe and provides the logic comparing unit 34 with the detected comparison result.

Figure 4:
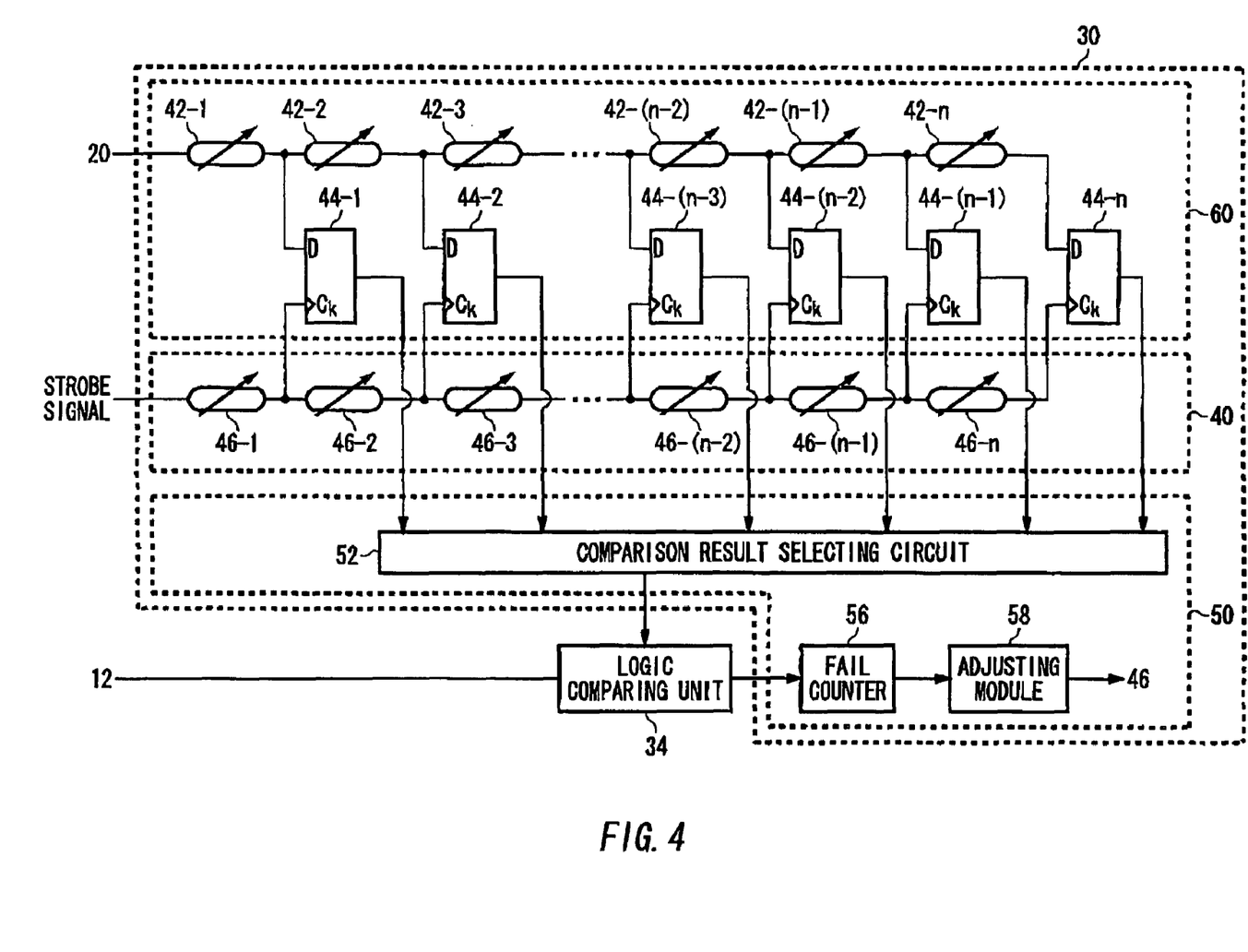
FIG. 4 shows an example of the configuration of a multi-strobe apparatus 30 and a timing comparing circuit 60.

FIG. 4 shows an example of the configuration of the multi-strobe apparatus 30. The multi-strobe apparatus 30 includes a strobe generating circuit 40 for generating a plurality of strobes, a timing comparing circuit 60 for detecting the comparison result of the driver comparator 20 by the multi-strobe, and a adjusting unit 50 for adjusting a timing of the strobe generating circuit 40 generating each of strobes. The strobe signal for generating the strobe is given to the strobe generating circuit 40. The strobe signal may be generated, for example, by the clock generating unit 70.

The strobe generating circuit 40 includes a plurality of cascade-connected variable delay circuits 46. Further, the timing comparing circuit 60 includes a plurality of cascade-connected delay elements 42 and a plurality of timing comparing units 44. The plurality of variable delay circuits 46 receive the strobe signals, delay the received strobe signals by a predetermined time, output each of them as a strobe, and generate the multi-strobe. The plurality of delay elements 42 provide the timing comparing units 44 with the output signal of the electronic device 200. Each of the plurality of timing comparing units 44 is provided so as to correspond to one of the variable delay circuits 46, receives the strobe output by the corresponding variable delay circuit 46 and the output signal of the electronic device 200, and detects a value of the output signal by the received strobe.

Each of the plurality of delay elements 42 is provided so as to correspond to one of the plurality of variable delay circuits 46, receives the comparison result of the comparator 32, delays the received comparison result successively by a predetermined time to provide to corresponding timing comparing unit 44. Each delay element 42 delays the received comparison result by an offset delay amount of the corresponding variable delay circuit 46.

Here, the offset delay amount is a delay amount generated in case a path of the variable delay circuit which generates the minimum delay amount is selected. For example, the offset delay amount points out a delay amount generated in case a path of the variable delay circuit which does not delay a signal is selected. In other words, the offset delay amount shows an error in delay time from a delay setting value of the variable delay circuit 46. It is possible to reduce the error in delay time of the variable delay circuit 46 by providing the timing comparing unit 44 with the received signal which is delayed by the offset delay amount of the corresponding variable delay circuit 46 by the delay element 42.

Each delay element 42 has characteristics substantially the same as those of the corresponding variable delay circuit 46 and is a variable delay circuit for adjustment wherein a delay amount of a delay path of the delay element 42 which generates the minimum delay is substantially the same as that of the corresponding variable delay circuit 46. The delay element 46 delays the received signal by the offset delay amount of the corresponding variable delay circuit 46 by using the delay path which generates the minimum delay of the variable delay circuit for adjustment.

For example, the delay element 42 is formed by a material and a process the same as those of the corresponding variable delay circuit 46. By using a variable delay circuit for adjustment which has characteristics the same as those of the corresponding variable delay circuit 46 as the delay element 42, it is possible to generate accurately a delay amount the same as the offset delay amount of the variable delay circuit 46. Further, even in case the offset delay amount of the variable delay circuit 46 is varied according to temperature variation, it is possible to absorb the variation by using the delay element 42 having the same characteristics.

Each of the timing comparing units 44 detects a value of the signal output by the delay element 42 at the timing of the strobe received from the corresponding variable delay circuit 46 and provides the logic comparing unit 34 with the value via the adjusting unit 50. The logic comparing unit 34 compares the value received from the timing comparing unit 44 with the expectation value generated by the pattern generating unit 12. The determining unit 16 described with respect to FIG. 1 determines pass/fail of the electronic device 200 on the basis of the comparison result of the logic comparing unit 34.

By the above operations, the testing apparatus 100 detects the value of the output signal of the electronic device 200 by the multi-strobe and determines pass/fail of the electronic device 200. Next, adjustment of timing of the plurality of strobes' generating is described with respect to the multi-strobe apparatus 30.

In case of adjusting the timing of the multi-strobe apparatus 30 generating the plurality of strobes, the clock generating unit 70 outputs a signal for adjustment wherein the value of the signal varies at the timing at which each of the plurality of strobes should be generated. In other words, the clock generating unit 70 outputs a signal for adjustment for adjusting a delay amount of each variable delay circuit 46. In this case, the pattern generating unit 12 outputs a signal for generating the signal for adjustment. The clock generating unit 70 generates the signal for adjustment synchronously with the strobe signal given to the multi-strobe apparatus 30.

The clock generating unit 70 can generate a signal for adjustment of which value accurately varies at a desired timing because the clock generating unit 70 generates the signal for adjustment by using the linearizing memory 24 and the variable delay circuit 22 (an adjusting signal generating variable delay circuit) calibrated as described above. First, the clock generating unit 70 outputs a signal for adjustment for setting a delay amount of a variable delay circuit 46-1 which is the first stage of the cascade-connected variable delay circuits 46. In other words, the clock generating unit 70 outputs a signal for adjustment of which value varies at a timing corresponding to a delay amount to be set for the variable delay circuit 46-1. The signal for adjustment is delayed by a delay amount substantially the same as the offset delay amount of the variable delay circuit 46 by the plurality of delay elements 42 and is provided to the timing comparing unit 44.

A timing comparing unit 44-1 detects a value of the signal for adjustment by using the strobe output by the variable delay circuit 46-1 and thus compares the timing of the variation point of the signal for adjustment with the timing of the strobe. The adjusting unit 50 sets a delay time of the variable delay circuit 46-1 on the basis of the comparison result of the timing comparing unit 44-1.

The clock generating unit 70 generates signals for adjustment successively at a plurality of times at which a plurality of strobes should be generated. The adjusting unit 50 sets delay times of all the variable delay circuits 46 successively to begin with the first stage variable delay circuit 46 on the basis of each of the signals for adjustment generated at the plurality of timings and thus adjusts the timing of the strobe generating circuit 40 generating each strobe.

The adjusting unit 50 includes a comparison result selecting circuit 52, a fail counter 56, and an adjusting module 58. The comparison result selecting circuit 52 selects a comparison result of the timing comparing unit 44 corresponding to the variable delay circuit 46 of which delay time should be adjusted out of the comparison results of the plurality of timing comparing units 44. The adjusting unit 50 adjusts the delay time of the variable delay circuit 46 so that the timing of the strobe output by the variable delay circuit 46 coincides with the variation point of the value of the signal for adjustment which should be adjusted on the basis of the selected comparison result.

For example, the adjusting unit 50 varies the delay time of the variable delay circuit 46 which should be adjusted and sets the delay time of the variable delay circuit 46 which should be adjusted to the delay time at which the timing comparing unit 44 judges that the timing of the strobe output by the delay time of the variable delay circuit 46 which should be adjusted substantially coincides with the timing of the signal for adjustment. For example, the adjusting module 58 varies sequentially the delay time of the variable delay circuit 46. Further, the clock generating unit 70 outputs the signal for adjustment each time the adjusting unit 50 varies the delay time of the variable delay circuit 46.

Further, the clock generating unit 70 may output the signal for adjustment a number of times each time the adjusting module 58 varies the delay time of the variable delay circuit 46 to be adjusted. In this case, the variable delay circuit 46 outputs the strobe a number of times according to the signals for adjustment and the timing comparing unit 44 detects the value of the signal for adjustment corresponding to each of the strobes. The comparison result selecting circuit 52 provides the fail counter 56 with a plurality of selected comparison results. The fail counter 56 counts one or both of how many times the value of the signal for adjustment is detected before and after the value of the signal for adjustment varies on the basis of the received comparison results.

The adjusting module 58 sets the delay time of the variable delay circuit 46 to be adjusted on the basis of the count result of the fail counter 56. For example, the adjusting module 58 sets the delay time of the variable delay circuit 46 to be adjusted to the delay time at which the number of detecting the value of the signal for adjustment before the value of the signal for adjustment varies is substantially the same as that after the value of the signal for adjustment varies. Further, the adjusting module 58 may set the delay time of the variable delay circuit 46 to be adjusted so that the number of detecting the value of the signal for adjustment before or after the value of the signal for adjustment varies is substantially half of the number of the variable delay circuit 46 to be adjusted outputting the strobe. Further, the adjusting module 58 may set the delay time of the variable delay circuit 46 to be adjusted to the delay time at which a difference between the numbers of detecting the value of the signal for adjustment before and after the value of the signal for adjustment is varied is the minimum out of the varied delay times.

In addition, the adjusting module 58 varies the delay time of the variable delay circuit 46 to be adjusted, for example, in the ascending order or in the descending order and sets the delay time of the variable delay circuit 46 to be adjusted on the basis of the basis of the count result corresponding to each delay time. Further, according to another example, the adjusting module 58 may vary the delay time of the variable delay circuit 46 to be adjusted, for example, by a binary searching method and detect the optimum delay time.

It is possible to set accurately each strobe interval of the multi-strobe to a desired interval by performing the setting of the delay time described above successively to begin with the first stage for all the variable delay circuits 46. Further, the testing apparatus 100 adjusts the delay time of the variable delay circuit 46 by using an output signal transfer path including the driver comparator 20, the delay element 42, and the timing comparing unit 44, which are used in case of performing the testing on the electronic device 200. Thus, it is possible to reduce influence of a timing error of the output signal and the multi-strobe generated due to characteristics of the output signal transfer path on the testing on the electronic device 20. For example, it is possible to reduce influence of a response characteristic of the timing comparing unit 44. Further, the multi-strobe apparatus 30 may further include a clock generating unit having a function and a configuration similar with those of the clock generating unit 70. In this case, the signal for adjustment is generated by the clock generating unit included in the multi-strobe apparatus 30.

Figure 5A:
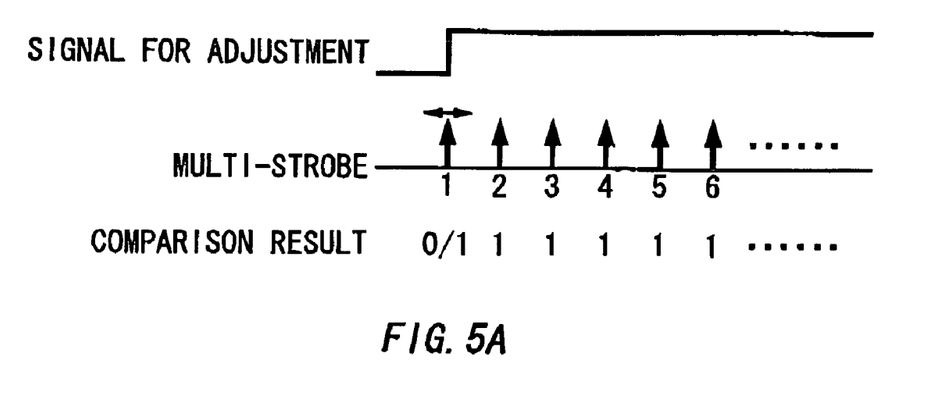
FIGS. 5A and 5B show timing adjustment of a strobe 1 and a strobe 2, respectively.

FIG. 5 describes timing adjustment of the strobes output by each variable delay circuit 46. According to the present example, the signal for adjustment is a signal of which value varies from zero (0) to one (1) at a timing of each variable delay circuit 46 outputting a strobe. First, as shown in FIG. 5A, the delay time of the first stage variable delay circuit 46-1 is varied and timing adjustment of a strobe 1 output by the variable delay circuit 46-1 is performed.

According to the timing adjustment of the strobe 1, the timing comparing unit 44-1 detects a value of a signal for adjustment of the strobe 1 a number of times, as described with respect to FIG. 4. Here, the delay time of the variable delay circuit 46-1 is set so that the comparison result of the timing comparing unit 44-1 says the number of detecting zero (0) which is a value before the value of the signal for adjustment is varied and the number of detecting one (1) which is a value after the value of the signal for adjustment is varied are substantially the same.

Figure 5B:
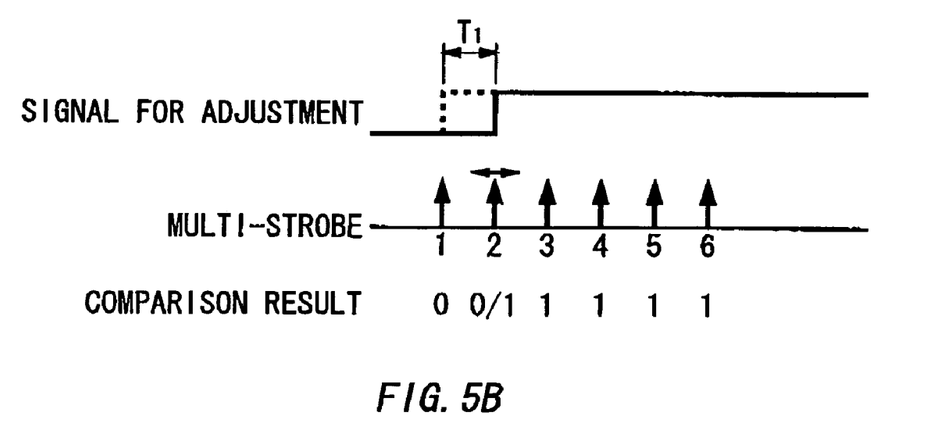

Next, the clock generating unit 70 generates a signal for adjustment of which value varies at a timing at which a strobe 2 should be generated. The adjusting unit 50 performs timing adjustment of the strobe 2 as shown in FIG. 5B, and then of all the strobes in the same way. For example, timing adjustment is performed so that all the strobe intervals become T1.

Figure 6:
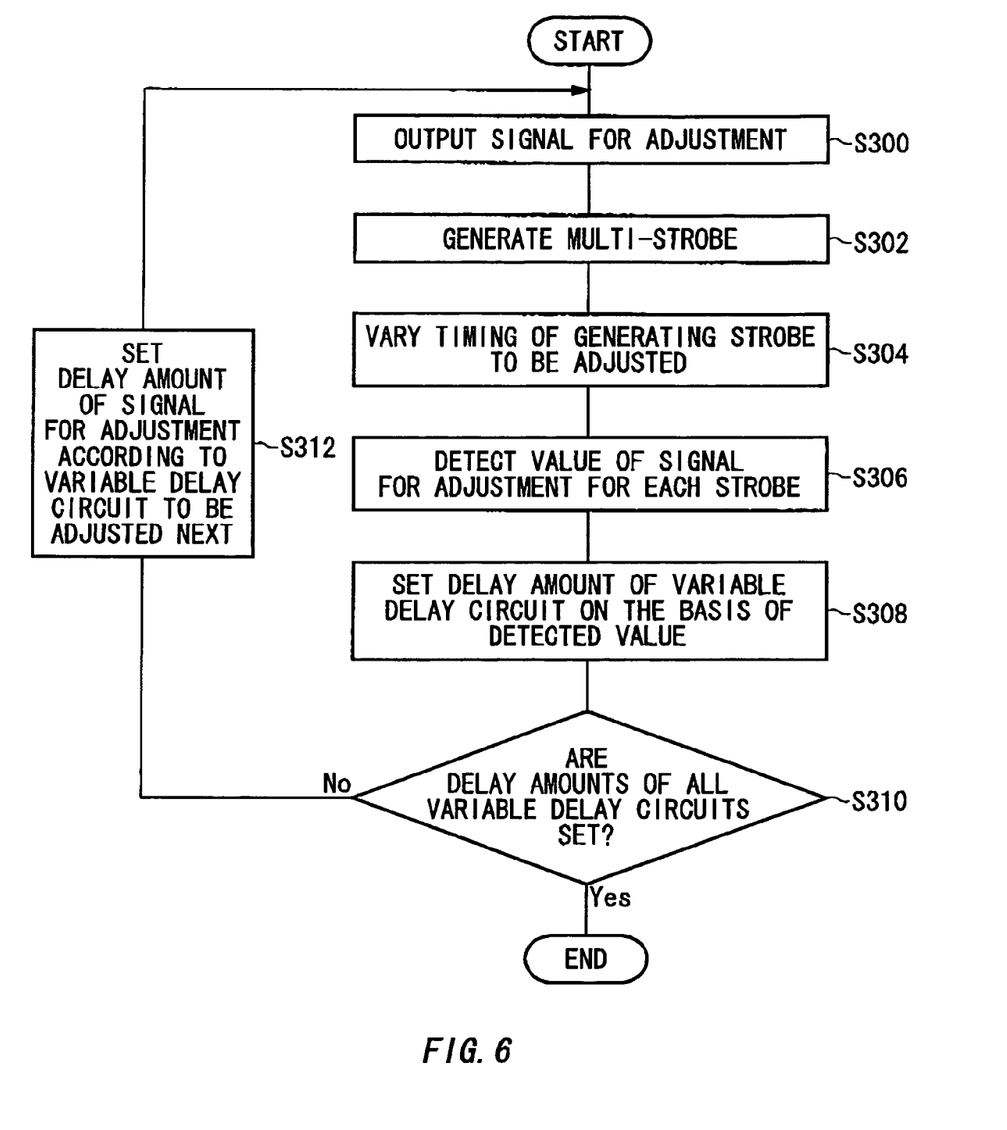
FIG. 6 is a flowchart showing a method for adjusting a timing of multi-strobe according to an embodiment of the present invention.

FIG. 6 is a flowchart showing a method for adjusting a timing of the multi-strobe according to an embodiment of the present invention. The adjusting method adjusts a timing of each strobe of the multi-strobe generated by the multi-strobe apparatus 30 in the same way with the multi-strobe apparatus described with respect to FIGS. 1 to 5.

First, in a signal for adjustment generating step S300, a signal for adjustment is generated and output at a timing at which each of a plurality of strobes should be generated. The S300 may be performed by using the clock generating unit 70 and the driver comparator 20 described with respect to FIG. 3.

Then, in a strobe generating step S302, multi-strobe having a plurality of strobes is generated. The S302 may be performed by using the strobe generating circuit 40 described with respect to FIG. 4.

Then, in a delay time varying step S304, a delay time of the variable delay circuit 46 which should be adjusted is varied and a timing of the strobe to be adjusted generating is varied. The S304 may be performed by using the adjusting unit 50 described with respect to FIG. 4.

Then, in a value detecting step S306, a value of the signal for adjustment of each strobe of which generating timing is varied is detected. In the S306, the value of the signal for adjustment of each generating timing may be detected a number of times as described above. The S306 may be performed by using the timing comparing unit 44 described with respect to FIG. 4.

Then, in a delay amount setting step S308, a delay amount of the variable delay circuit which should be adjusted is set on the basis of the value detected in the S306. The S308 may be performed by using the adjusting unit 50 described with respect to FIG. 4.

Then, in a determining step S310, it is determined whether or not the delay amount is set for all the variable delay circuits 46. In case the delay amount is set for all the variable delay circuits 46, the procedure is finished. Further, in case the delay amount is not set for all the variable delay circuits 46, a delay amount of the signal for adjustment is set according to the variable delay circuit 46 to be adjusted next and the processes of S300 to S310 are repeated. According to the present adjusting method, it is possible to adjust accurately the timing of each strobe of the multi-strobe generating.

As obvious from the above description, according to the present invention, it is possible to generate multi-strobe wherein a timing of each strobe of the multi-strobe is controlled accurately. Therefore, it is possible to test an electronic device accurately.

Although the present invention has been described by way of exemplary embodiments, it should be understood that those skilled in the art might make many changes and substitutions without departing from the spirit and the scope of the present invention, which is defined only by the appended claims.

What is claimed is:

1. A multi-strobe apparatus for generating multi-strobe having a plurality of strobes comprising:
   a clock generating unit which is able to generate a signal for adjustment at a timing at which each of the plurality of strobes should be generated;
   a strobe generating circuit for generating the plurality of strobes; and
   an adjusting module for adjusting a timing of said strobe generating circuit's generating each of the strobes on the basis of the signal for adjustment.

2. A multi-strobe apparatus as claimed in claim 1, wherein said clock generating unit generates the signals for adjustment sequentially at the plurality of timings at which the plurality of strobes should be generated, and
   on the basis of each of the signals for adjustment generated at the plurality of timings, said adjusting module adjusts a timing of said strobe generating circuit's generating corresponding strobe.

3. A multi-strobe apparatus as claimed in claim 2, wherein said strobe generating circuit includes a plurality of cascade-connected variable delay circuits each of which receives a strobe signal, delays the received strobe signal by a predetermined time, and outputs the strobe signal sequentially as the strobe, and
   on the basis of each of the signals for adjustment, said adjusting unit adjusts a delay time of corresponding variable delay circuit sequentially.

4. A multi-strobe apparatus as claimed in claim 3, wherein said clock generating unit generates the signal for adjustment synchronously with the strobe signal.

5. A multi-strobe apparatus as claimed in claim 4 further comprising a plurality of timing comparing units each of which is provided to correspond to one of said variable delay circuits and compares a timing of the strobe output by said corresponding variable delay circuit with the timing of the signal for adjustment, wherein
   said adjusting unit adjusts the delay time of each of said variable delay circuits on the basis of the comparison result of the corresponding timing comparing unit.

6. A multi-strobe apparatus as claimed in claim 5, wherein said adjusting unit varies the delay time of said variable delay circuit of which delay time should be adjusted and sets the delay time of said variable delay circuit to be adjusted to the delay time at which said timing comparing unit determines that the timing of the strobe output by said variable delay circuit to be adjusted and the timing of the signal for adjustment are substantially the same.

7. A multi-strobe apparatus as claimed in claim 6, wherein
said variable delay circuit outputs the strobe a number of times at every delay time varied by said adjusting unit,
said clock generating unit generates the signal for adjustment of which value varies at the timing at which said adjusted variable delay circuit should output the strobe a number of times,
said timing comparing unit detects a value of the signal for adjustment by using the strobes output a number of times, and
said adjusting unit sets the delay time of said variable delay circuit to the delay time at which the number of times of said timing comparing unit's detecting the value of the signal for adjustment before the value of the signal for adjustment is varied and that after the value of the signal for adjustment is varied are substantially the same.

8. A multi-strobe apparatus as claimed in claim 7, wherein said adjusting unit comprises
a comparison result selecting unit for selecting a comparison result of said comparing unit corresponding to said variable delay circuit to be adjusted out of the comparison results of said plurality of timing comparing units, and
a fail counter for counting the number of times of detecting the value of the signal for adjustment before the value of the signal for adjustment is varied and that after the value of the signal for adjustment is varied.

9. A multi-strobe apparatus as claimed in claim 5 further comprising a plurality of cascade-connected delay elements each of which is provided to correspond to one of said plurality of variable delay circuits, delays the signal for adjustment by an offset delay amount of said corresponding variable delay circuit, and outputs said corresponding timing comparing unit with the signal for adjustment.

10. A multi-strobe apparatus as claimed in claim 9, wherein each of said delay elements has characteristics substantially the same as those of said corresponding variable delay circuit and delays the signal for adjustment by the offset delay amount by using a delay path generating the minimum delay of a variable delay circuit for adjustment in which a delay amount of the delay path generating the minimum delay is substantially the same as a delay amount of a delay path generating the minimum delay of said corresponding variable delay circuit.

11. A multi-strobe apparatus as claimed in claim 1, wherein
said clock generating unit includes an adjusting signal generating variable delay circuit for delaying the signal for adjustment by a desired delay amount and outputting it and a linearizing memory for controlling a delay amount of said adjusting signal generating variable delay circuit.

12. A testing apparatus for testing an electronic device comprising:
a pattern generating unit for generating a test pattern for testing the electronic device;
a pattern formatter for formatting the test pattern and providing the electronic device with it; and
a determining unit for determining pass/fail of the electronic device on the basis of an output signal output by the electronic device according to the test pattern,
wherein said determining unit comprises a multi-strobe apparatus for generating multi-strobe having a plurality of strobes for detecting a value of the output signal, and
said multi-strobe apparatus comprises
a clock generating unit which is able to generate a signal for adjustment at a timing at which each of the plurality of strobes should be generated;
a strobe generating circuit for generating the plurality of strobes; and
an adjusting module for adjusting a timing of said strobe generating circuit's generating each of the strobes on the basis of the signal for adjustment.

13. A testing method for adjusting a timing of generating each of a plurality of strobes included in multi-strobe comprising:
a signal for adjustment generating step of generating a signal for adjustment at a timing at which each of a plurality of strobes should be generated;
a strobe generating step of generating the plurality of strobes; and
an adjusting step of adjusting a timing of generating each of the strobes in said strobe generating step on the basis of the signal for adjustment.

* * * * *